United States Patent
Wan et al.

(10) Patent No.: US 7,372,392 B1
(45) Date of Patent: May 13, 2008

(54) CHARGE BALANCING METHOD IN A CURRENT INPUT ADC

(75) Inventors: Jun Wan, Wilmington, MA (US); Peter R. Holloway, North Andover, MA (US)

(73) Assignee: National Semiconductor Corporation, Sant Clara, CA (US)

( * ) Notice: Subject to any disclaimer, the term of this patent is extended or adjusted under 35 U.S.C. 154(b) by 0 days.

(21) Appl. No.: 11/679,070

(22) Filed: Feb. 26, 2007

(51) Int. Cl.
*H03M 1/12* (2006.01)
(52) U.S. Cl. .................. 341/172; 341/155
(58) Field of Classification Search .......... 341/172, 341/155, 118; 326/83
See application file for complete search history.

(56) References Cited

U.S. PATENT DOCUMENTS

| | | | | |
|---|---|---|---|---|
| 5,479,130 | A | * | 12/1995 | McCartney ............... 327/341 |
| 6,651,036 | B2 | * | 11/2003 | Petrofsky ................. 702/198 |
| 6,750,796 | B1 | | 6/2004 | Holloway et al. ......... 341/143 |
| 6,869,216 | B1 | | 3/2005 | Holloway et al. ......... 374/170 |
| 6,956,411 | B1 | * | 10/2005 | Holloway ................. 327/94 |
| 6,957,910 | B1 | * | 10/2005 | Wan et al. ................ 374/183 |
| 6,962,436 | B1 | | 11/2005 | Holloway et al. ......... 374/170 |
| 7,075,475 | B1 | | 7/2006 | Wan ......................... 341/172 |
| 7,164,379 | B1 | * | 1/2007 | Rao ........................ 361/161 |
| 7,196,579 | B2 | * | 3/2007 | Ozawa ..................... 330/133 |

OTHER PUBLICATIONS

Nicolas Clement et al., "A Foundry MOSFET Electrometer for Single-Electron Detection," International Microprocessor and Nanotechnology Conference, Digest of Papers, Oct. 27-29, 2004, pp. 74-75.
S. S. Rajput et al., "High Current Injection Effects of the Switching JFET's in the Current Electrometers," IEEE Transactions on Instrumentation and Measurement, vol. 45, No. 1, Feb. 1996, pp. 314-316.
J. F. Duque-Carrillo et al., "High-Bandwidth CMOS Test Buffer with Very Small Input Capacitance," Electronic Letters, Dec. 6, 1990, vol. 26, No. 25, pp. 2084-2086.

* cited by examiner

*Primary Examiner*—Peguy JeanPierre
(74) *Attorney, Agent, or Firm*—Patent Law Group LLP; Carmen C. Cook (57) ABSTRACT

A method for charge balancing in a current input ADC including maintaining a low capacitance value at the integrator output node where the capacitance value is independent of the integrator output voltage and operating conditions, generating a first voltage pedestal at a first active device switch at the end of the autozero phase having a first voltage polarity and a first magnitude, generating a second voltage pedestal at a second active device switch at the end of the integration phase having an opposite voltage polarity and the first magnitude, and summing the first voltage pedestal with the second voltage pedestal. The difference between the first voltage pedestal and the second voltage pedestal results in a net voltage error. The first and second voltage pedestals have the first magnitude under all operating conditions of the modulator and the two voltage pedestals cancel to yield a small net voltage error.

7 Claims, 7 Drawing Sheets

CHARGE BALANCING METHOD IN A CURRENT INPUT ADC

CROSS-REFERENCE TO RELATED APPLICATIONS

This application is related to the following commonly assigned and concurrently filed U.S. patent application Ser. No. 11/679,053, entitled "Low Current Offset Integrator with Signal Independent Low Input Capacitance Buffer Circuit," of Jun Wan and Peter R. Holloway, which patent application is incorporated herein by reference in its entirety.

FIELD OF THE INVENTION

The invention relates to a method in a current input ADC and, in particular, to a method for charge balancing in a current input ADC.

DESCRIPTION OF THE RELATED ART

Analog-to-digital converters are used in converting or digitizing an analog input signal to generate a digital output signal indicative of the value of the analog input signal within a given conversion time. A current input ADC refers to an ADC that receives a low level input current as the analog input signal to be digitized. Current input ADCs are sometimes referred to as Coulomb-meters because the ADCs measure the integral of the input current over their conversion time which is equivalent to the charge having units measured in Coulombs.

In general, a current input ADC is formed by a charge balancing modulator coupled to digital processing circuitry. The charge balancing modulator is in turn formed by an integrator receiving the analog input signal, a charge packet or current-mode feedback DAC driven by the digital processing circuitry and a buffer coupled to the output node of the integrator. The integrator typically includes active device switches, such as NMOS or PMOS transistor switches, to reconfigure the modulator at different clock phases to perform different operations, such as integration and reset or autozero functions.

One factor that affects the accuracy of a current input ADC is the input current offset error. Input offset error is the non-zero value of the digital output signal of the ADC when the actual input current is zero. There are typically multiple sources of errors that contribute to the ADC's input current offset error. For instance, circuitry outside of the ADC circuit, such as the electro static discharge (ESD) circuit can introduce input current offset error. However, the dominant error source is usually the injection of non-zero charge packets by active device switches in the integrator circuit used to reconfigure the modulator throughout different clock phases to carry out the different operational functions. To improve the accuracy and resolution of a current input ADC, it is necessary to reduce the input current offset error.

DETAILED DESCRIPTION OF THE PREFERRED EMBODIMENTS

In accordance with the principles of the present invention, a buffer circuit with signal-independent low input capacitance uses bootstrapping techniques at the input device so that the channel region of the input device is insensitive to the absolute input voltage at the gate of the input device. Furthermore, bootstrapping techniques are used to establish local feedback paths to greatly reduce the input capacitance at the input device. The advantages of the buffer circuit are that both the magnitude and the variance of the input capacitance of the buffer circuit are decreased by several orders of magnitude over conventional devices.

In particular, the low input capacitance buffer circuit of the present invention has particular application in analog-to-digital converters (ADCs), especially in current input ADCs receiving a low level input current to be digitized. The buffer circuit of the present invention can be coupled to an integrator to form a charge balancing modulator to form the front end of a current input ADC. The resulting current input ADC exhibits very low input current offset error. The buffer circuit of the present invention eliminates the dominant error sources in conventional buffer circuits arising from variations in the input capacitance of the buffer as a function of the input signal voltage, which then reflect back to the input as an offset current error. Greatly reduced variations in input capacitance of the buffer circuit as the input voltage changes necessarily cause much less charge to be drawn from the integrator feedback capacitor. The accuracy of the ADC is thereby greatly improved.

According to another aspect of the present invention, a method for charge balancing in a charge-based ADC is implemented to reduce voltage errors that result in input current offset errors of the ADC. The charge balancing method of the present invention realizes a nearly perfect cancellation of the opposing voltage pedestals generated in the active switching devices of the integrator so that the voltage error at the output of the integrator stage is significantly reduced. Reducing the voltage error at the output of the integrator stage is equivalent to reducing the input current offset error of the current input ADC.

Figure 1:
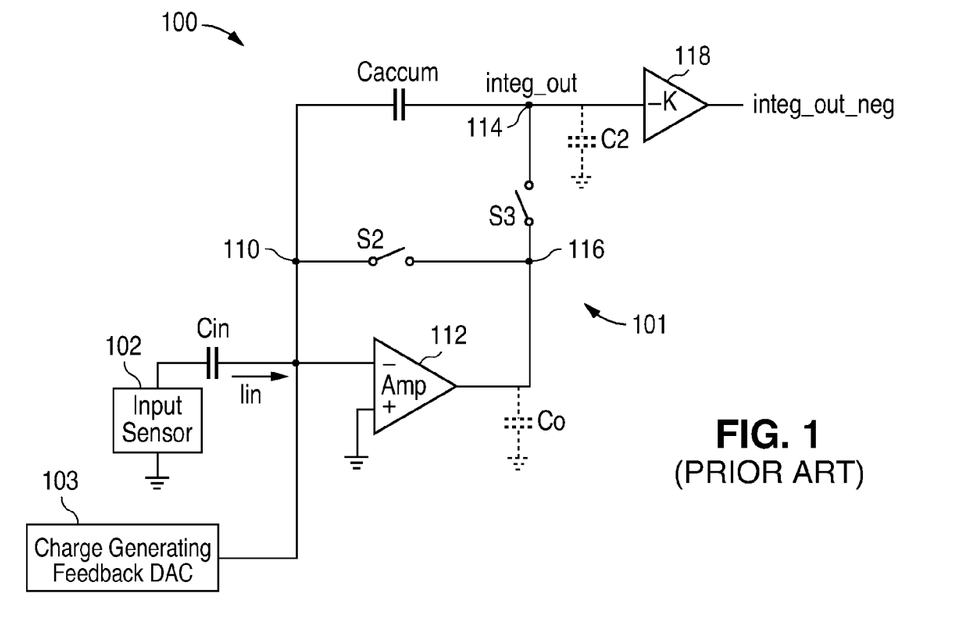
FIG. 1 is a schematic diagram of a conventional charge balancing modulator which can be used to form the front end of a current input ADC.

FIG. 1 is a schematic diagram of a conventional charge balancing modulator which can be used to form the front end of a current input ADC. Referring to FIG. 1, a charge balancing modulator 100 includes an integrator 101, a buffer 118 coupled to the integrator output node integ_out (node 114) and a charge generating feedback DAC 103. Charge generating feedback DAC 103 is coupled to integrator 101 through a capacitor Cdac. In the exemplary embodiment shown in FIG. 1, integrator 101 is formed by an input capacitor Cin, an operational amplifier 112 and an accumulation capacitor Caccum. Integrator 101 receives an analog input signal from an input sensor 102 where the input signal is AC coupled through input capacitor Cin to the inverting input terminal of amplifier 112. Accumulation capacitor Caccum is switchably connected across amplifier 112. In FIG. 1, capacitor Co denotes the output capacitance of amplifier 112 while capacitor C2 denotes the input capacitance of buffer 118. It is understood that capacitors Co and C2 are not explicit capacitor elements but rather represents the equivalent capacitance as seen at the respective terminals.

When charge balancing modulator 100 is used as the front-end of a current input ADC, the ADC operates exclusively in the integrate and autozero phases. Active device switches S2 and S3 are used to configure the integrator 101 through the clock phases to perform the integration and autozero functions. Specifically, when switch S2 is closed and switch S3 is open, the amplifier 112 is shorted and the integrator 101 performs the autozero function. During autozero, the integrator 101 samples the input voltage offset and stores the offset voltage at capacitor Cin. Then, when switch S2 is open and switch S3 is closed, integration of the input current Iin flowing through Cin is enabled.

The source of the input current offset error of concern here arises from the channel charge of active device switches S2 and S3. FIGS. 2(a)-(d) illustrate the configuration of the integrator 101 of FIG. 1 and the resulting impedance as the integrator is being reconfigured into the integrate and autozero phases by switches S2 and S3. Switches S2 and S3 are controlled by non-overlapping clock signals. At time t1 (FIG. 2(a)), switch S3 is already open in the previous clock phase and switch S2 opens. Then at time t2 (FIG. 2(b)), switch S3 is closed to configure the integrator in the integration phase. The amplifier is connected in a negative feedback loop with the accumulation capacitor Caccum to integrate the input current. Then at time t3 (FIG. 2(c)), switch S3 opens. Finally, at time t4 (FIG. 2(d)), switch S2 is closed to perform the autozero function of the integrator. The operation of the modulator continues by returning to the configuration of time t1 to prepare the integrator for the integration function.

Figure 2A:
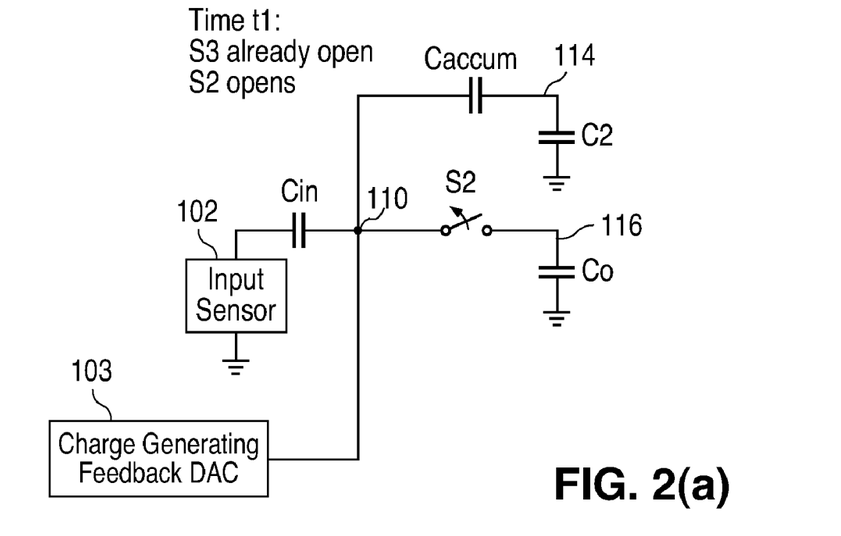
FIGS. 2(a)-(d) illustrate the configuration of the integrator of FIG. 1 and the resulting changes in the capacitive reactance, or impedance, as the integrator is being reconfigured into the integrate and auto-zero phases by switches S2 and S3.
Figure 2B:
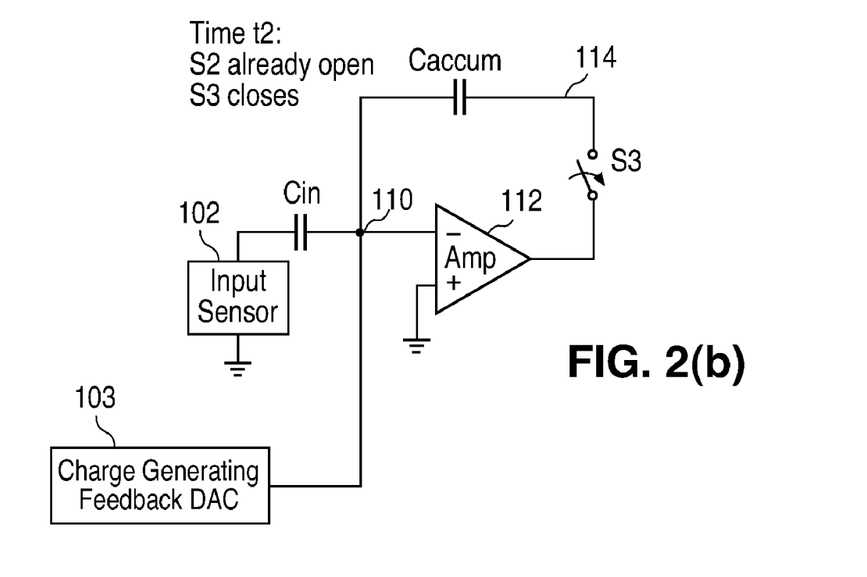

When switch S2 opens at time t1, the charge previously held in the channel of the active device to provide a conductive path through the active device switch must completely leave the channel region in order to eliminate any conductance through the switch in its intended off state. When the charge is leaving the channel of switch S2, some fraction of the channel charge goes into node 110 at the input of the integrator while the remainder of the channel charge goes into node 116 at the output of the amplifier 112.

In the present illustration, it is assumed that switch S2 is implemented as an NMOS active device with electrons as the channel charge. The charge entering node 110 is therefore negative and this current is absorbed by capacitor Caccum. Charge flowing through the accumulation capacitor Caccum creates a positive-going voltage pedestal at node 114 which is the continuous-time integrator output node. This increase in voltage is indistinguishable from changes in the voltage due to the input current received at Cin from the input sensor which was integrated by the integrator. As a result, an input current offset error is introduced at the integrator output node (114).

Figure 2C:
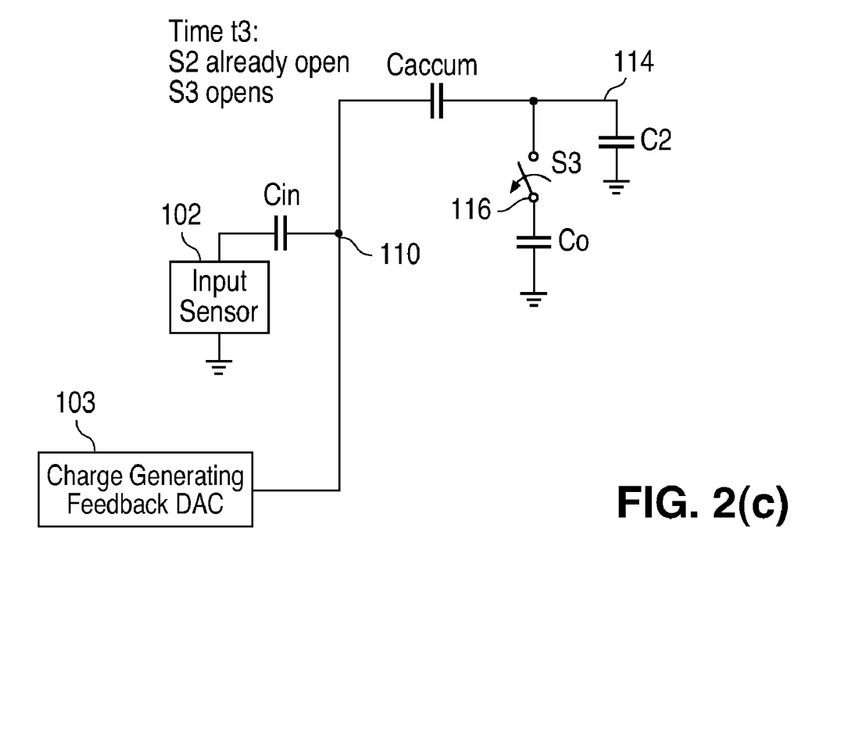
Figure 2D:
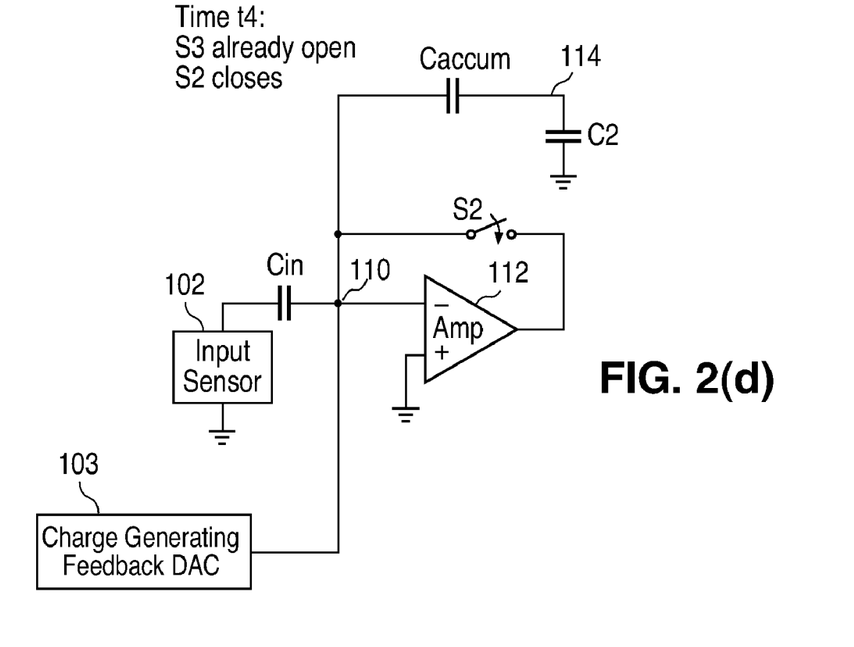

This input current offset error can be mitigated by the action of active device switch S3. When switch S3 goes from close to open, it will generate a negative-going voltage pedestal at node 114 assuming switch S3 is an NMOS device whose channel accumulates electrons when on. These two effects are opposing in sign. If the voltage pedestals generated by switches S2 and S3 can be made to be matched in magnitude, then the resulting net voltage error at the integrated output node 114 can be made small. Since this is the output of the integrator stage, reducing the voltage error at the integrator output is equivalent to saying that the input current offset error is reduced since the output of the integrator is ideally a function of only the input current.

In accordance with the principles of the present invention, a buffer circuit is configured to achieve a nearly perfect cancellation of the opposing voltage pedestals generated by the active device switches in the integrator of a charge balancing modulator by making the input capacitance of the buffer circuit both constant and very small. As a result, the input current offset error of the charge balancing modulator is reduced to lower levels than previously achievable. When the charge balancing modulator incorporating the buffer circuit of the present invention is used to form the front-end of a current input ADC, the ADC can achieve significant improvements in the accuracy and resolution of the analog-to-digital conversion because of the low level of input current offset error.

Figure 3:
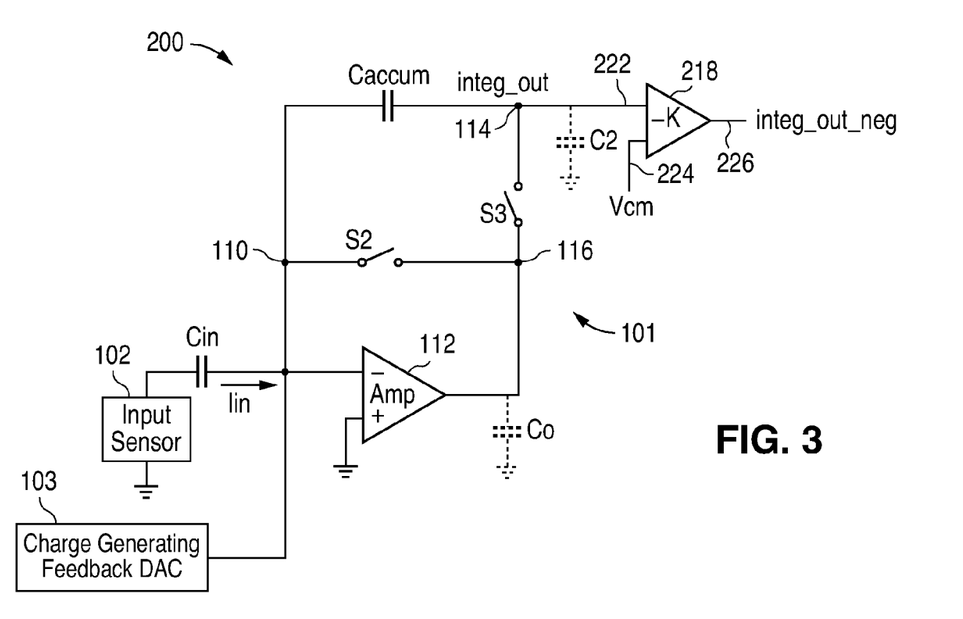
FIG. 3 is a schematic diagram of a charge balancing modulator incorporating a buffer circuit according to one embodiment of the present invention.

FIG. 3 is a schematic diagram of a charge balancing modulator incorporating a buffer circuit according to one embodiment of the present invention. The charge balancing modulator of FIG. 3 can be used to form the front end of a current input ADC to realize an ADC with high conversion accuracy and high resolution. Like elements in FIGS. 1 and 3 are given like reference numerals to simplify the discussion. Referring to FIG. 3, a charge balancing modulator 200 includes an integrator 101 and a buffer 218 coupled to the integrator output node integ_out (node 114). Integrator 101 is formed by an input capacitor Cin, an operational amplifier 112 and an accumulation capacitor Caccum. Integrator 101 receives an analog input signal from an input sensor 102 where the input signal is AC coupled through input capacitor Cin to the inverting input terminal of amplifier 112. Modulator 200 can be applied to sample and digitize a variety of analog signal sources. Thus, input sensor 102 represents a sensing element suitable for the parameter being measured. Accumulation capacitor Caccum is switchably connected across amplifier 112. In FIG. 3, capacitor Co denotes the output capacitance of amplifier 112 while capacitor C2 denotes the input capacitance of buffer 218. It is understood that capacitors Co and C2 are not explicit capacitor elements but rather represents the equivalent capacitance at the respective terminals.

Integrator 101 further includes active device switches S2 and S3 for configuring the integrator to operate in either the integration mode or the autozero mode in different clock phases. Specifically, when switch S2 is closed and switch S3 is open, the amplifier 112 is shorted and the integrator 101 performs the autozero function. During autozero, the integrator 101 samples the input voltage offset and stores the offset voltage at capacitor Cin. Then, when switch S2 is open and switch S3 is closed, integration of the input current Iin flowing through Cin is enabled.

Buffer circuit 218 is a low input capacitance buffer circuit where the input capacitance does not vary with operating conditions. More specifically, the input capacitance of buffer circuit 218 does not vary with the input voltage at the input terminal of the buffer. When applied to form charge balancing modulator 200, buffer circuit 218 is instrumental in reducing the input current offset error of the modulator. As described above, input current offset error refers to the value of the digital output signal of the modulator or the ADC when the actual input current is zero. Low input capacitance buffer circuit 218 operates to tightly control the injection of non-zero charge packets from active device switches in the integrator 101 to realize a near perfect cancellation of the opposing voltage pedestal generated by the switches in integrator 101.

There are four factors that determine the charge injection errors and the resulting degree of cancellation of the opposing voltage pedestal errors in integrator 101. The first factor is the amount of charge in the channel region of each active device switch, including the ability to predict and control the absolute magnitude of the channel charge over time, temperature and process. The second factor is the division of channel charge in each active device switch between its two terminals, including the controllability and repeatability of this charge division. The third factor is the matching of the opposing charge injection based voltage pedestal errors, which is minimally a function of the physical dimensions and operating points of active device switches S2 and S3. Finally, the fourth factor concerns the variation of any of the above three factors with changes in signal voltages appearing at the integrator output terminal (node 114).

Of the four factors, the dominating error source is the last factor. In particular, the division of channel charge in each of the active device switches S2, S3 when the switch is open depends almost entirely on the values and ratio of values of the capacitances appearing on both terminals of the active device switches for fast switching conditions. The capacitances of concern include the input capacitance C2 of the high impedance buffer circuit. In general, a buffer circuit includes an active input device, such as a PMOS or NMOS transistor where the gate terminal of the active input device is coupled to receive the input voltage to the buffer circuit. The input capacitance of a buffer circuit is therefore the gate capacitance of the active input device.

Figure 5A:
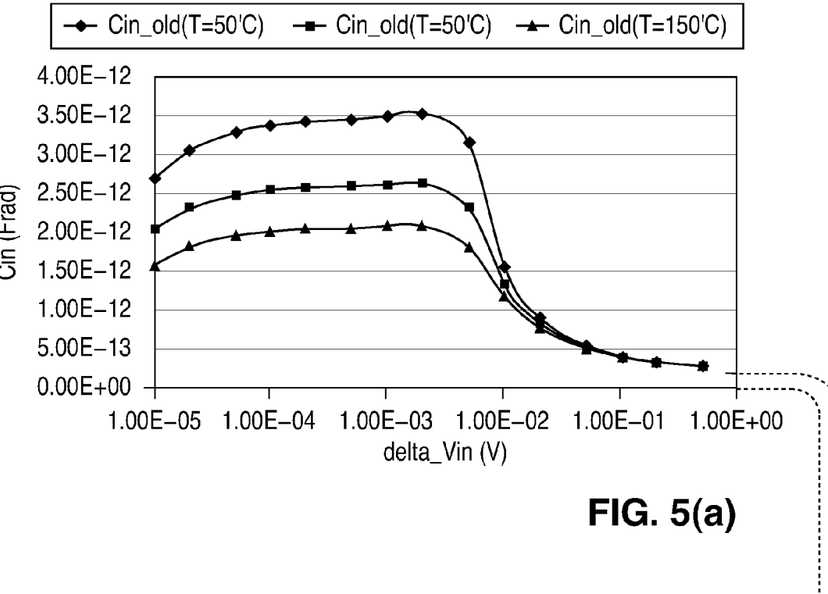
FIG. 5(a) illustrates the input (gate) capacitance of a conventional buffer circuit over a range of input voltages and over different operating temperatures.

It is well known to those practiced in the art that the gate capacitance of an active MOS device varies largely with the bias conditions of the MOS device. FIG. 5(a) illustrates the input (gate) capacitance of a conventional buffer circuit over a range of input voltages and over different operating temperatures. As shown in FIG. 5(a), a variation of input capacitance of a buffer circuit of greater than 90% is observed when the differential input voltage changes from 10 µV to 1V. In the prior art illustration of FIG. 5(a), the input capacitance of the conventional buffer circuit varies as much as 3.25 picoFarads.

Referring to FIG. 1, since the buffer input capacitance, denoted as C2, varies the total capacitance seen at floating output node 114 by a very large amount, the division of channel charge in active device switch S3, when the switch goes from on (closed) to off (open), between the switch's two terminals will be greatly affected, thus substantially changing the degree of pedestal voltage mismatch and therefore cancellation of the opposing polarity pedestal errors.

When there is voltage mismatch between the voltage pedestals, a residue of these imbalanced voltage pedestals remains on the output terminal 114. This output voltage error is equivalent to an input current offset error through the equivalence of charge, Q, being defined both as $C \cdot V$ as well as $\int I \partial t$. So, for a given output voltage error, $\Delta V$, when multiplied by capacitance $C_{accum}$, must equal the product of the offset current $I_{offset}$ and $\Delta t$ (where $\Delta t$ denotes the conversion time). Thus offset current $I_{offset} = C_{accum} \cdot \Delta V / \Delta t$.

Since both capacitance $C_{accum}$ and $\Delta t$ are system level parameters, not design variables, the only way to reduce the input current offset error $I_{offset}$ is to minimize the output voltage error $\Delta V$ as much as possible. In accordance with the present invention, a buffer circuit is constructed so that both the absolute magnitude of the buffer input capacitance, C2, as well as the variation in the buffer input capacitance with signal voltage at its input terminal (i.e., $\partial C2/\partial V$) is reduced several orders of magnitude below those levels achieved in conventional buffer circuits. In other words, the input capacitance of the buffer circuit is low and is also kept constant, independent of the buffer input voltage value and operating conditions, such as fabrication process, temperature and supply voltage variations.

The detail construction of the buffer circuit in accordance with one embodiment of the present invention will now be described. As shown in FIG. 3, in one embodiment, the buffer circuit 218 has a first input terminal 222 receiving an input voltage, a second input terminal 224 receiving a common mode voltage Vcm, and an output terminal 226 providing the buffered output voltage. Buffer circuit 218 also receives bias currents to support its operation. The common mode voltage Vcm is a DC reference voltage. In the present embodiment, buffer 218 is an inverting buffer having a gain of −K where K is a whole or fractional number. In other embodiments, buffer 218 can be formed as a non-inverting buffer. Furthermore, in the embodiment shown in FIG. 3, the buffer circuit 218 has a single-ended output 226. In other embodiments, the buffer circuit of the present invention can provide differential output signals.

Figure 4:
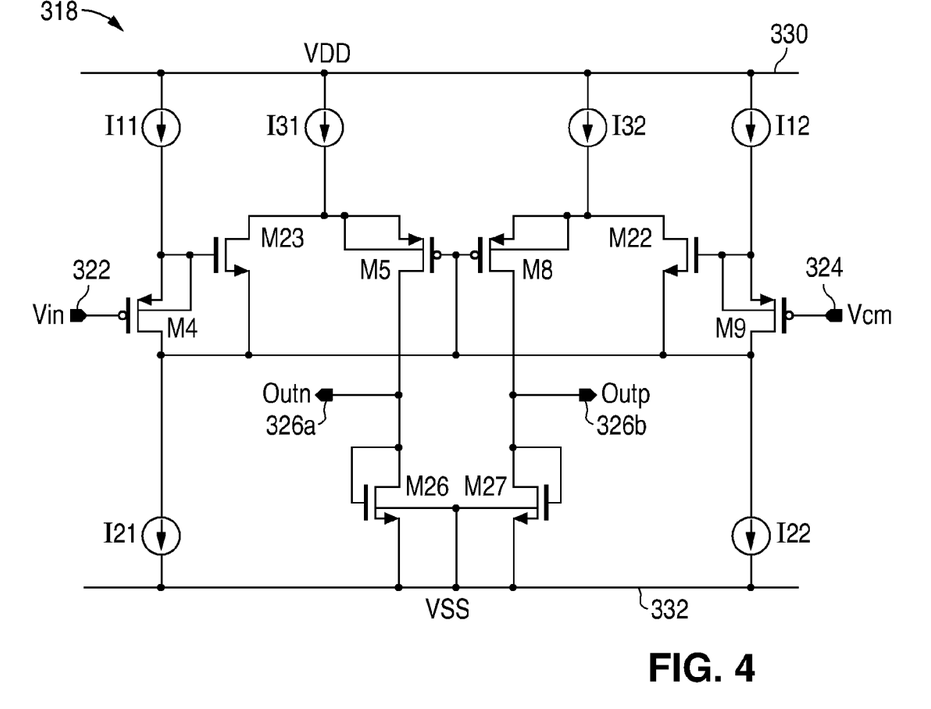
FIG. 4 is a schematic diagram of the buffer circuit according to one embodiment of the present invention.

FIG. 4 is a schematic diagram of the buffer circuit according to one embodiment of the present invention. Referring to FIG. 4, a buffer circuit 318 has a first input terminal 322 receiving the input voltage Vin and a second input terminal 324 receiving the common mode input voltage Vcm. In the present embodiment, buffer circuit 318 provides differential output signals Outn and Outp on output terminals 326a and 326b. In the present embodiment, buffer circuit 318 includes two identical half circuits, each half circuit including a PMOS source follower (transistor M4 or M9), an NMOS transconductance amplifier (Gm) device (transistor M23 or M22) which also serves as a source follower to hold the drain-to-source voltage Vds on the PMOS input transistors M4, M9 constant and a PMOS folded cascode device (transistor M5 and M8). Each half circuit is biased by bias current sources and provides one of the differential output signals. NMOS transistors M26 and M27 function as the output load devices for the differential output signals Outn and Outp.

Buffer circuit 318 includes a PMOS transistor M4 as the active input device. The kernel idea of the buffer circuit is to bootstrap the input PMOS device so that the body-to-source voltage Vbs, the drain-to-source voltage Vds, the drain-to-source current Ids (and therefore the gate-to-source voltage Vgs) are independent of the input signal at the gate of the input PMOS device. In this way, the input PMOS device does not see any operational change to its voltage and current biasing. The channel region of the input PMOS device is kept at a constant operating condition where both the channel charge and the depletion charge are insensitive to the absolute input voltage at the gate of the input PMOS device.

The input capacitance of the buffer circuit 318 is the capacitance as seen at the gate terminal of the PMOS transistor M4 which is the active input device of buffer circuit 318. The actual effective input capacitance is not equal to the input transistor gate capacitance, Cgs, but is equal to Cgs multiplied by a factor equal to $(1-1/Av)$, where Av is the voltage gain from the gate to source of transistor M4. Since this gain approaches unity, the effective input capacitance is two to three orders of magnitude lower than Cgs. Any change in operating point of the buffer circuit can change the gate input capacitance of input transistor M4 and thereby change the effective input capacitance. Three things that change the operating point are: (1) changes in current Ids (the drain-to-source current) of the input transistor; (2) changes in voltage Vds (the drain-to-source voltage) of the input transistor; and, (3) changes in voltage Vsb (the source-to-body voltage) of the input transistor.

In buffer circuit 318, the input PMOS transistor M4 has its drain-to-source current Ids set to a constant value by a current source I11 providing a current I11 and a current source I21 providing a current I21. Current source I21 is coupled to the drain terminal of input transistor M4. The source of input transistor M4 is fed by current source I11. Current I11 is less than current I21, which is feeding the drain of M4. Thus, any excess current provided by current source I21 not flowing through transistor M4 is carried off by NMOS transistor M23 which forms one-half of a transconductance amplifier device. NMOS transistor M23 has its gate terminal connected to the source terminal of transistor M4, its source terminal connected to the drain terminal of transistor M4 and its drain terminal receiving a bias current I31 from a current source I31.

The actual value of current Ids for transistor M4 is set by the current provided by current source I11, which is the current entering the source terminal of transistor M4. In the present embodiment, current I11 has a current value of Ibias, where Ibias denotes a given bias current value, while current I21 has a current value of 2*Ibias. By supplying input device M4 with current I11 and by using transistor M23 to drain off any excess current from current source I21 not flowing through input device M4, the drain-to-source current Ids of input device M4 is held constant and no changes in current Ids is experienced by transistor M4 even as the gate voltage at transistor M4 changes. In this manner, condition (1) above that causes variations in the input capacitance of transistor M4 is eliminated.

To maintain a constant drain-to-source voltage Vds at transistor M4, voltage Vds of transistor M4 is forced to be exactly equal to the gate-to-source voltage Vgs of transistor M23. Since transistor M23 is fed itself by a current which is the difference of two constant current sources, the drain-to-source current Ids of transistor M23 is also constant, helping to maintain its voltage Vgs independent of the input signal voltage. To isolate voltage Vgs of transistor M23 from changes in input voltage, voltage Vds of transistor M23 is made constant. This is accomplished by forcing voltage Vds of transistor M23 to equal to the gate-to-source voltage Vgs of a PMOS transistor M5, whose current Ids is determined by a fixed current source I31 providing a current I31. Current source I31 shares its current between NMOS transistor M23 and PMOS transistor M5. However, since current Ids of transistor M23 was already set to be constant, the remainder portion of current available for transistor M5 is constant as well. In the present embodiment, current I31 has a current value of 2*Ibias.

By setting the gate-to-source voltage of transistor M23 to be constant, the drain-to-source voltage Vds of transistor M4 is set to a constant value as well. Condition (2) above that causes variations in the input capacitance of transistor M4 is eliminated.

In buffer circuit 318, the bulk or the body of input transistor M4 is shorted to its source terminal. In this manner, the body-to-source voltage of transistor M4 is held constant at 0 Volts. This technique is commonly referred to as "bootstrapping," because the bulk connection (bootstrap), is carried along by the voltage at the source terminal of transistor M4. Wherever the source voltage of transistor M4 goes, so does the bulk voltage. Condition (3) above that causes variations in the input capacitance of transistor M4 is eliminated.

Furthermore, bootstrapping is employed in other circuit connections in buffer circuit 318 to improve the buffer circuit operation. First, the drain terminal of transistor M4 is bootstrapped to the source terminal of transistor M23. Thus, the drain terminal of transistor M4 follows the gate terminal of transistor M23 which is connected to the source terminal of transistor M4. The source terminal of transistor M4 follows the gate voltage of transistor M4 which receives the input signal. As a result, all four terminals (source, drain, gate and body) of transistor M4 tracks with the input signal Vin on node 322. Since transistor M4 experiences no change in current Ids and no change in voltage Vds or voltage Vbs when the input signal changes, no change in input capacitance of transistor M4 results. The gate-to-source capacitance Cgs of transistor M4, although significant, is not seen by the input as a capacitance because the gate to source voltage of the parasitic capacitance Cgs is constant.

Second, the drain terminal of transistor M23 is connected to the source terminal of PMOS transistor M5. Thus, the drain terminal of transistor M23 is bootstrapped to the input voltage through the gate and source connections of PMOS transistor M5. The gate terminal of transistor M5 is connected to the source terminal of transistor M23 (node 350). Since the voltage at the source terminal of transistor M23 follows the input voltage, the drain terminal of transistor M23 then also follows the input voltage.

Third, the bulk or body of transistor M5 is connected to its source terminal, thus making the body-to-source voltage Vbs of transistor M5 constant at 0 Volts. In this manner, the gate, source and bulk terminals of transistor M5 all follow the input signal together, experiencing no change in voltage Vgs or voltage Vsb.

Transistor M5 serves in three distinct roles in buffer circuit 318. First, transistor M5 serves as a bootstrap for the drain terminal of transistor M23. Second, transistor M5 serves as a folded cascode for the drain terminal of transistor M23, reflecting changes in the instantaneous drain current of transistor M23 down to the output terminal Outn (node 326a). Finally, transistor M5 serves as a bootstrap for its own bulk terminal.

Transistor M23 serves in two roles in buffer circuit 318. First, transistor M23 serves as a bootstrap for the drain-to-source voltage of transistor M4. Second, transistor M23 serves as a transconductance amplifier (Gm) in conjunction with its opposite partner, transistor M22, forming a differential pair of source connected transistors.

Transistor M4 serves two roles in buffer circuit 318 as well. First, transistor M4 operates to buffer and carry the input signal Vin to the gate terminal of transistor M23.

Second, transistor M4 serves as a bootstrap, driving its bulk terminal with its own source voltage.

As described above, the buffer circuit 318 is formed by a symmetrical copy of two identical half circuits, each half circuit including a source follower device, a Gm device and a folded cascode device. The above description discusses the first half circuit including transistor M4 as the source follower, transistor M23 as the transconductance amplifier device, and transistor M5 as the folded cascode device. The second half circuit in buffer circuit 318 includes transistor M9 as the source follower, transistor M22 as the transconductance amplifier device, and transistor M8 as the folded cascode device. The second half circuit is constructed in the same manner and is operated in the same manner as the first half circuit and operate in the same manner with transistor M9 receiving the common mode voltage Vcm.

In buffer circuit 318, the NMOS Gm devices M23 and M22 are source connected to the common source node 350. The common source node serves as a common mode voltage source that is used to bootstrap both the drain terminals of the PMOS source followers M4 and M9 and the gate terminals of the PMOS folded cascode devices M5 and M8. The two local feedback paths thus formed enhance the power supply rejection ratio (PSRR) and the common mode rejection ratio (CMRR) substantially, in addition to ensuring a large reduction of input capacitance achieved. Through the bootstrapping techniques applied in the circuit, both the magnitude and the variance of the input capacitance of the buffer circuit are decreased by several orders of magnitude. Importantly, the magnitude and the variance of the input capacitance of the buffer circuit are reduced under all operating conditions, including the buffer input voltage, fabrication process, temperature and power supply voltage variations.

Figure 5B:
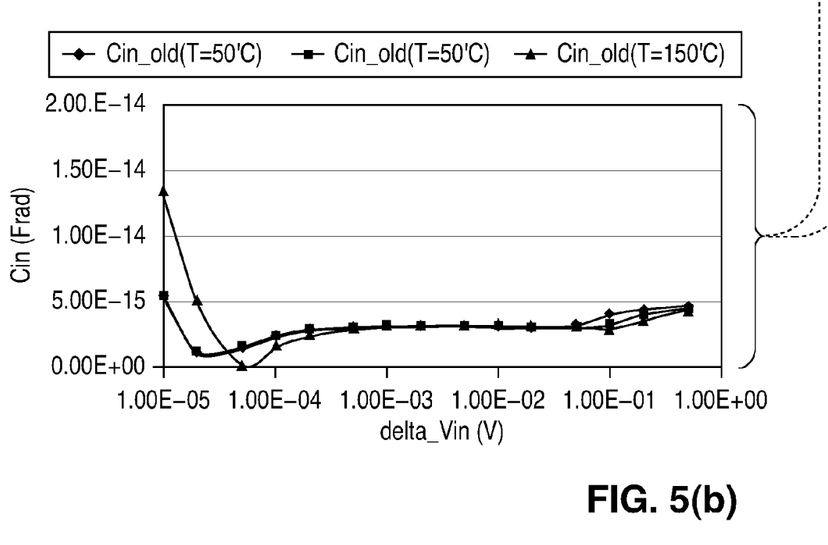
FIG. 5(b) illustrates the input (gate) capacitance of the buffer circuit of the present invention over a range of input voltages and over different operating temperatures.

In summary, the result of all of the constant current biasing and bootstrapping techniques implemented in the fully differential buffer circuit 318 is that the effective input capacitance of the buffer is reduced to almost nothing. FIG. 5($b$) illustrates the input (gate) capacitance of the buffer circuit of the present invention over a range of input voltages and over different operating temperatures. As shown in FIG. 5($b$), both the magnitude, and the variance, of the input capacitance of the buffer circuit of the present invention is lowered by several orders of magnitude. In fact, the full vertical scale of FIG. 5($b$) is only 4% of the vertical scale of FIG. 5($a$). Therefore, as compared to the conventional buffer circuit, the input capacitance of the buffer circuit of the present invention is negligible.

Figure 6:
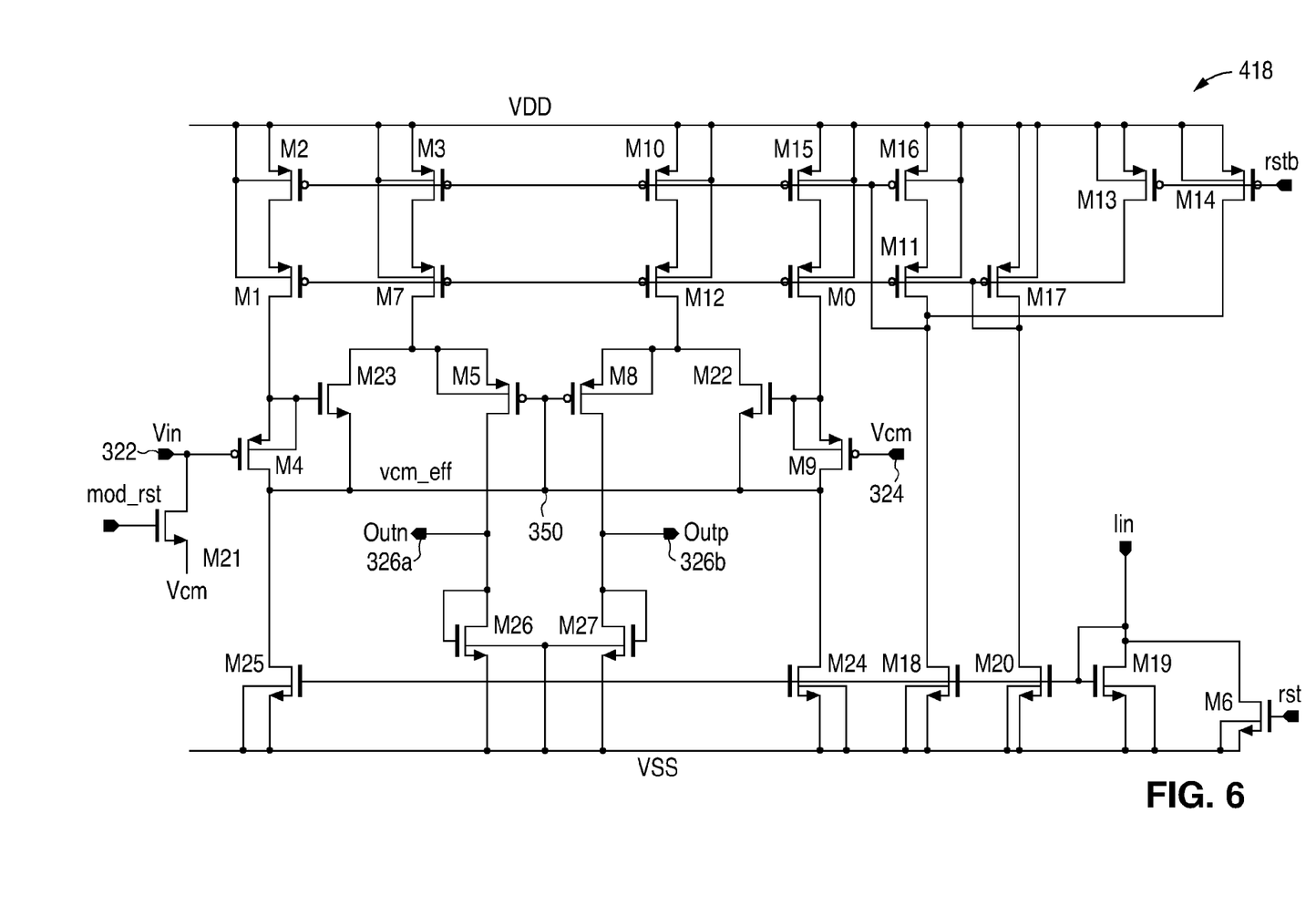
FIG. 6 is a transistor level implementation of the buffer circuit of FIG. 4 according to one embodiment of the present invention.

FIG. 6 is a transistor level implementation of the buffer circuit of FIG. 4 according to one embodiment of the present invention. Like elements in FIGS. 4 and 6 are given like reference numerals to simplify the discussion. Referring to FIG. 6, an input current Iin is provided to current mirrors in buffer circuit 418 to generate the several constant currents used to bias the transistors of the buffer circuit. Current source I21 is formed by an NMOS transistor M25. Current source I22 is formed by an NMOS transistor M24. Current source I11 is formed by serially connected PMOS transistors M2 and M1. Current source I31 is formed by serially connected PMOS transistors M3 and M7. Current source I12 is formed by serially connected PMOS transistors M15 and M0. Current source I32 is formed by serially connected PMOS transistors M10 and M12.

Figure 7:
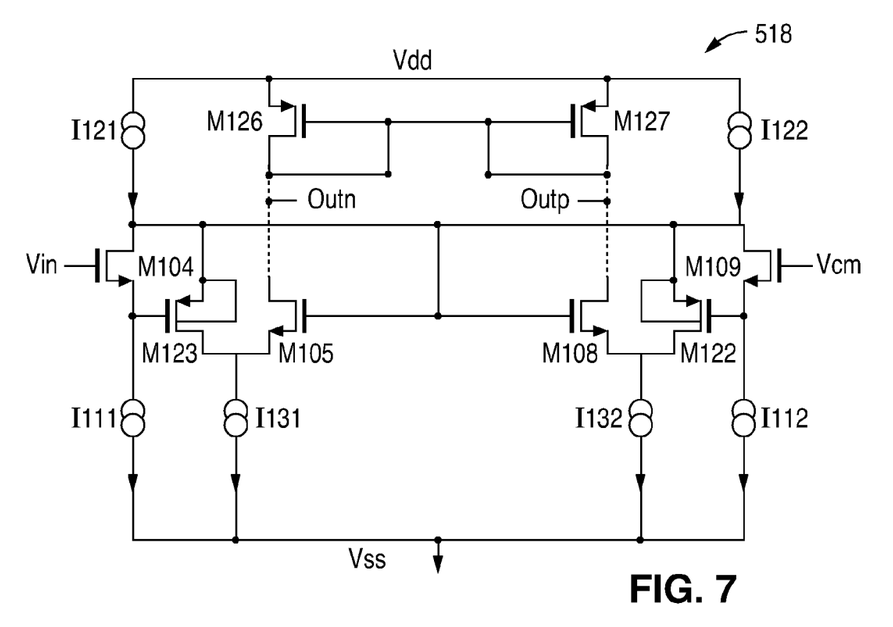
FIG. 7 is a schematic diagram of the buffer circuit according to an alternate embodiment of the present invention.

In the buffer circuit of FIG. 4, the input devices are PMOS transistors with corresponding NMOS transconductance amplifier and PMOS folded cascode devices. The buffer circuit of the present invention can also be formed using transistors of the opposite polarities with the corresponding changes in the voltage/current polarities coupled thereto. FIG. 7 is a schematic diagram of the buffer circuit according to an alternate embodiment of the present invention. Referring to FIG. 7, buffer circuit 518 is identical to buffer circuit 318 of FIG. 4 except that buffer circuit 518 is a complementary version of the buffer circuit 318. That is, PMOS transistors are replaced with NMOS transistors and vice versa. Buffer circuit 518 also illustrates the changes in voltage polarities corresponding to the changes in the transistor type. In the first half circuit of buffer circuit 518, current source I111 has a current value of Ibias, where Ibias denotes a given bias current value. Current sources I121 and I31 each has a current value of 2*Ibias. Similarly for the second half circuit, current source I112 has a current value of Ibias while current sources I122 and I132 each has a current value of 2*Ibias.

In FIG. 7, the drain terminal of transistor M105 is shown connected to the drain terminal of transistor M126 through a dotted line. The dotted line connection is used to represent that one or more cascode transistors can be added at the dotted line location in the actual implementation of the circuit. These cascode transistors are not shown in the simplified circuit diagram of FIG. 7.

Figure 8:
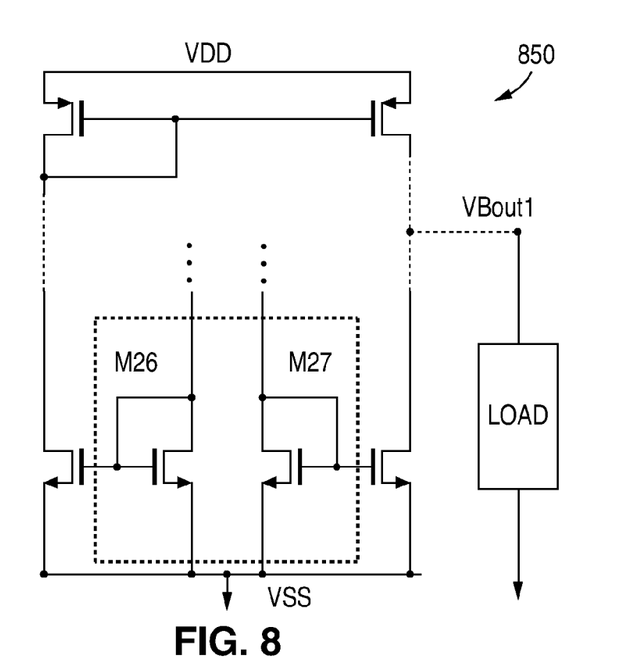
FIG. 8 is a schematic diagram illustrating one embodiment of a differential-to-single-ended conversion circuit which can be coupled to the differential output terminals of the buffer circuit of FIG. 4.
Figure 9:
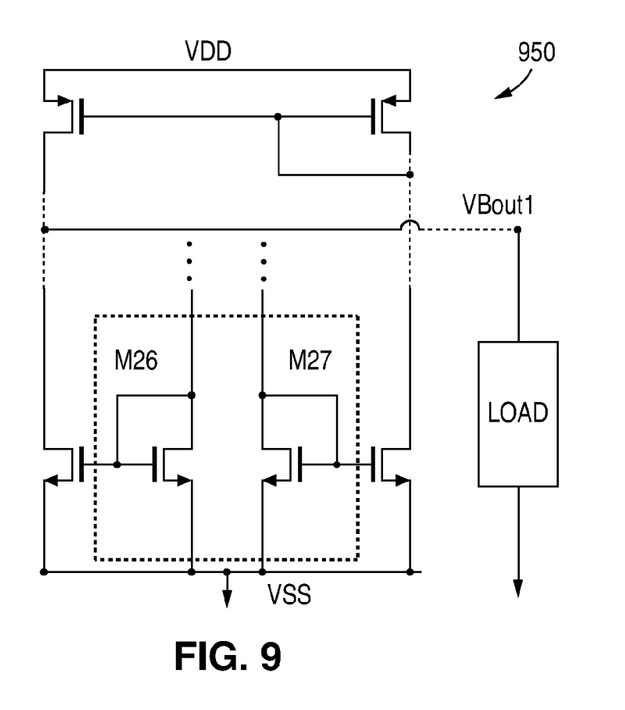
FIG. 9 is a schematic diagram illustrating one embodiment of a differential-to-single-ended conversion circuit which can be coupled to the differential output terminals of the buffer circuit of FIG. 4.

In the buffer circuit of FIG. 4, the buffer circuit provides differential output signals Outn and Outp on output terminals 326$a$ and 326$b$. In some applications, the differential output signals are used directly as the buffer output signals. In other applications, a single-ended output is desired. According to alternate embodiments of the present invention, the buffer circuit of the present invention incorporates differential-to-single-ended conversion circuitry to provide either an inverting or a non-inverting buffer output signal. FIG. 8 is a schematic diagram illustrating one embodiment of a differential-to-single-ended conversion circuit which can be coupled to the differential output terminals of the buffer circuit of FIG. 4 to provide an inverting buffer output signal VBoutI. FIG. 9 is a schematic diagram illustrating one embodiment of a differential-to-single-ended conversion circuit which can be coupled to the differential output terminals of the buffer circuit of FIG. 4 to provide a non-inverting buffer output signal VBout.

In FIGS. 8 and 9, the dotted line connections are used to represent that one or more cascode transistors can be added at the dotted line locations in the actual implementation of the circuit. These cascode transistors are not shown in the simplified circuit diagram of FIGS. 8 and 9.

Charge Balancing Method in an ADC

As described above, the low input capacitance buffer circuit of the present invention is particularly advantageous when applied in a modulator to form a charge-based or current input ADC. Referring to FIG. 3, the buffer circuit of the present invention is coupled to the output terminal of an integrator to form a charge balancing modulator as the front end to a current input ADC. When the buffer circuit of the present invention is thus incorporated, the buffer circuit 218 facilitates a unique charge balancing operation in the modulator to realize a significant reduction in the voltage errors that result in input current offset errors of the ADC.

According to another aspect of the present invention, a method for charge balancing in a charge-based ADC uses a low input capacitance buffer circuit coupled to receive the integrator output voltage. Moreover, the input capacitance of the buffer circuit is independent of the integrator output voltage, that is, the input capacitance C2 (denoting the input capacitance of buffer circuit 218) does not vary with the integrator output voltage on node 114. While the magnitude of the channel charge generated by switches S2 and S3 can be made the same by proper sizing of switches S2 and S3, the division of the channel charge of switches S2 and S3 when the switches are being closed and open depends greatly on the capacitance as seen at the terminals of the two switches. By eliminating the capacitance variations of the input capacitance C2 with the signal voltage at the integrator output node, the division of the channel charge of active device switches S2 and S3 can be made to be exactly matching, thereby ensuring precise cancellation of the two opposing voltage pedestals generated by active device switches S2 and S3.

The charge balancing method in accordance of the present invention ensures that voltage errors due to activation and deactivation of the active switching devices do not accumulate at the integrator output node. By eliminating these voltage errors that result in input current offset errors of the ADC, the resulting ADC will exhibit a very low input current offset error for variations in temperature, supply voltage and device parameters and the resulting accuracy and performance of the ADC is greatly improved.

In one embodiment, a charge balancing method in a charge-based ADC is implemented using a charge balancing modulator formed by an integrator and a buffer coupled to the continuous-time output of the integrator. The modulator operates in alternate integration and autozero phases. The buffer is implemented using a low input capacitance buffer circuit where the input capacitance does not vary with the input voltage to the buffer circuit. The charge balancing method of the present invention operates to cause a negative-going voltage pedestal to be generated by a first active device switch at the continuous-time output of the integrator during the autozero phase. The method further operates to cause a positive-going voltage pedestal to be generated by a second active device switch at the continuous-time output of the integrator during the integration phase. The two voltage pedestals are opposite in sign and matched in magnitude under all operating conditions. The operating conditions include different integrator output voltages, fabrication process, temperature and power supply voltage variations.

The resulting net voltage error is thereby made very small. The charge balancing methodology of the present invention realizes a nearly perfect cancellation of these opposing voltage pedestals so that the voltage error at the output of the integrator stage is significantly reduced. Reducing the voltage error at the output of the integrator stage is equivalent to reducing the input current offset error of the current input ADC.

The above detailed descriptions are provided to illustrate specific embodiments of the present invention and are not intended to be limiting. Numerous modifications and variations within the scope of the present invention are possible. For instance, the buffer circuit of the present invention can be used with any integrator circuit to form a charge balancing modulator. The construction of the integrator is not critical to the practice of the present invention. The present invention is defined by the appended claims.

We claim:

1. A method for charge balancing in a current input ADC, the current input ADC comprising a charge balancing modulator formed by an integrator providing an integrator output voltage at an integrator output node and a plurality of active device switches, the modulator being configured by active device switches to operate in alternate integration and autozero phases, the method comprising:
    maintaining a low capacitance value at the integrator output node where the capacitance value is independent of the integrator output voltage and does not vary operating conditions of the current input ADC;
    generating a first voltage pedestal at the integrator output node by a first active device switch at the end of the autozero phase of the modulator, the first voltage pedestal having a first voltage polarity and having a first magnitude;
    generating a second voltage pedestal at the integrator output node by a second active device switch at the end of the integration phase of the modulator, the second voltage pedestal having a second voltage polarity, opposite to the first voltage polarity, and having the first magnitude; and
    summing the first voltage pedestal with the second voltage pedestal at the integrator output node, the difference between the first voltage pedestal and the second voltage pedestal resulting in a net voltage error;
    wherein the first and second voltage pedestals have the first magnitude under all operating conditions of the current input ADC and the two voltage pedestals cancel to yield a near zero net voltage error at the integrator output voltage.

2. The method of claim 1, wherein maintaining a low capacitance value at the integrator output node comprises:
    providing a low input capacitance buffer circuit; and
    coupling an input terminal of the buffer circuit to the integrator output terminal, the buffer circuit having low input capacitance where the input capacitance is independent of the integrator output voltage and does not vary with operating conditions of the current input ADC.

3. The method of claim 2, wherein the operating conditions comprise any one of fabrication process, temperature and power supply voltage variations.

4. The method of claim 1, wherein the operating conditions comprise any one of fabrication process, temperature and power supply voltage variations.

5. The method of claim 1, wherein the first voltage pedestal comprises a negative-going voltage pedestal and the second voltage pedestal comprises a positive-going voltage pedestal.

6. The method of claim 1, wherein generating a first voltage pedestal at a first active device switch comprises:
    opening the first active device switch at the end of the autozero phase; and
    dividing the channel charge of the first active device switch, a portion of the divided channel charge being coupled to the output terminal of the integrator as the first voltage pedestal.

7. The method of claim 1, wherein generating a second voltage pedestal at a second active device switch comprises:
    opening the second active device switch at the end of the integration phase; and
    dividing the channel charge of the second active device switch, a portion of the divided channel charge being coupled to the output terminal of the integrator as the second voltage pedestal.

* * * * *